United States Patent [19]

Stade et al.

[11] Patent Number: 5,289,629
[45] Date of Patent: Mar. 1, 1994

[54] APPARATUS FOR JOINING A CONDUCTOR TRACK FOIL TO AN ELECTRICAL COMPONENT

[75] Inventors: Horst Stade, Blaichach; Helmut Deringer, Stuttgart, both of Fed. Rep. of Germany

[73] Assignee: Robert Bosch GmbH, Stuttgart, Fed. Rep. of Germany

[21] Appl. No.: 968,070

[22] Filed: Oct. 28, 1992

Related U.S. Application Data

[62] Division of Ser. No. 788,383, Nov. 6, 1991, Pat. No. 5,193,270.

[30] Foreign Application Priority Data

Dec. 22, 1990 [DE] Fed. Rep. of Germany ....... 4041507

[51] Int. Cl.$^5$ .......................... B23P 19/04; B26D 7/02
[52] U.S. Cl. ........................................ 29/743; 29/759; 29/DIG. 44; 83/451
[58] Field of Search ....................... 29/592.1, 743, 753, 29/759, 760, 761, DIG. 44, 17.1–17.4; 174/261; 269/21; 83/29, 100, 451; 439/77

[56] References Cited

U.S. PATENT DOCUMENTS

| | | | |
|---|---|---|---|
| 3,663,786 | 5/1972 | O'Connor | 29/592.1 X |
| 4,204,319 | 5/1980 | Bishop | 29/743 X |
| 4,485,712 | 12/1984 | Gerber | 83/29 X |
| 4,778,326 | 10/1988 | Althouse et al. | 269/21 X |
| 4,852,439 | 8/1989 | Levene et al. | 83/451 X |

FOREIGN PATENT DOCUMENTS 0303485 2/1989 European Pat. Off. .
348311 12/1989 European Pat. Off. .
3836405 5/1990 Fed. Rep. of Germany .
1388425 12/1964 France .
1440481 4/1966 France .
2041663 9/1980 United Kingdom .
2179884 3/1987 United Kingdom .
89/10286 11/1989 World Int. Prop. O. .

OTHER PUBLICATIONS

"Heat Sink Assembly Tool" IBM Technical Disclosure Bulletin, vol. 32, No. 6B, Nov. 1989, pp. 17–19.

Primary Examiner—Peter Dungba Vo
Attorney, Agent, or Firm—Edwin E. Greigg; Ronald E. Greigg

[57] ABSTRACT

A mounting apparatus for attaining a tolerance-insensitive connection of a conductor track foil with contact pins of an electrical component. The conductor track foil includes two insulating layers with an intervening conducting layer with lands in the upper layer for soldering the conductive layer to the contact pins of the electrical component. The conductor track foil is lowered, positionally correctly, onto the electrical component by use of a mounting device. The bottom insulating layer and the conducting layer of the soldering lands, which are free of an insulating layer on the top, are pierced by the contact pins extending at right angles to the conductor track foil. The conductor track foil is released by the mounting apparatus. A soldered connection is made between the lands and the contact pins. As a result, an electrically reliably gap free conducting connection is attainable even if the contact pins are eccentrically associated with the soldering lands.

3 Claims, 2 Drawing Sheets

APPARATUS FOR JOINING A CONDUCTOR TRACK FOIL TO AN ELECTRICAL COMPONENT

This is a divisional of copending application Ser. No. 07/788,383 filed on Nov. 6, 1991 now U.S. Pat. No. 5,193,270.

BACKGROUND OF THE INVENTION

The invention is based on an apparatus for joining a conductor track foil, comprising a conductor layer embedded between insulating layers, to at least one electrical component having contact pins as defined herein.

For the sake of economical manufacture, an attempt has been made to manufacture individual parts with the widest possible tolerances and join them into component units or devices. Difficulties arise, however, if electrical components having contact pins with considerable positional tolerances are to be combined with the soldering lands of flexible conductor track foils, because these foils are unable to withstand the forces exerted by the contact pins. The solder is also incapable of spanning gaps several millimeters wide between the contact pin and the punched hole of the soldering land. Moreover, the strength of a soldered connection decreases with increasing gap width.

It is known from (German Patent Application P 40 26 722.9) to slip a disk onto each of the contact pins of the electrical component; the corresponding soldering land of the conductor track foil has a relatively large punched hole and is supported on this disk. Next, moistening is performed, with solder that covers the applicable contact pin, the associated soldering land and the region of the disk located inside the soldering land, to attain a secure electrical and mechanical connection. The disk serves as a substrate for the conductor track foil and also serves as an intermediary between the contact pin and the land for soldering. However, with this apparatus, provisions must be made to secure the disks positionally on the contact pins and to secure the conductor track foil positionally on the disks, until the soldered connection has been made.

OBJECT AND SUMMARY OF THE INVENTION

The apparatus according to the invention has an advantage over the prior art that even before the soldering is done, a form-fitting and positively engaged connection of the flexible conductor track foil and the contact pins is produced, which protects the foil against separation from the pins. Another advantage is a virtually gap-free boundary between the conductor layer and the applicable contact pin. It is very particularly advantageous, however, that positional tolerances between the contact pin and the land for soldering are of secondary importance, because the contact pin can pass through at an arbitrary point within the surface of the land for soldering. In the case of a contact pin disposed eccentrically in the land for soldering, a secure soldered connection can also be produced.

With the apparatus defined herein, considerable advantages in manufacture and assembly are attained, because a punched hole in the lands for soldering can be dispensed with, and relatively wide positional tolerances between the contact pins and the soldering lands of the conductor track foil can be allowed. Moreover, less strain on the contact pins and the conductor track foil during the joining process is achieved, because contact pins embodied in this way generate little penetration resistance, generate a drawing cut by means of an oblique cutting edge, and avoid tearing of the conductor track foil.

The apparatus defined, makes handling of the conductor track foils easier, for instance from when it is taken out of a magazine until it is joined to the electrical component. As a result, a secure association of the lands for soldering of the conductor track foil with the contact pins of the electrical component is attained. To avoid an impermissible strain on the flexible conductor track foil during joining, a provision is made that avoids pulling the lands for soldering into the recesses in the plate.

An example of an apparatus according to the invention for producing a device having a plurality of electrical components and a conductor track foil, using the apparatus for mounting the conductor track foil, is described in further detail below in conjunction with the drawing.

DESCRIPTION OF THE PREFERRED EMBODIMENT

Figure 1:
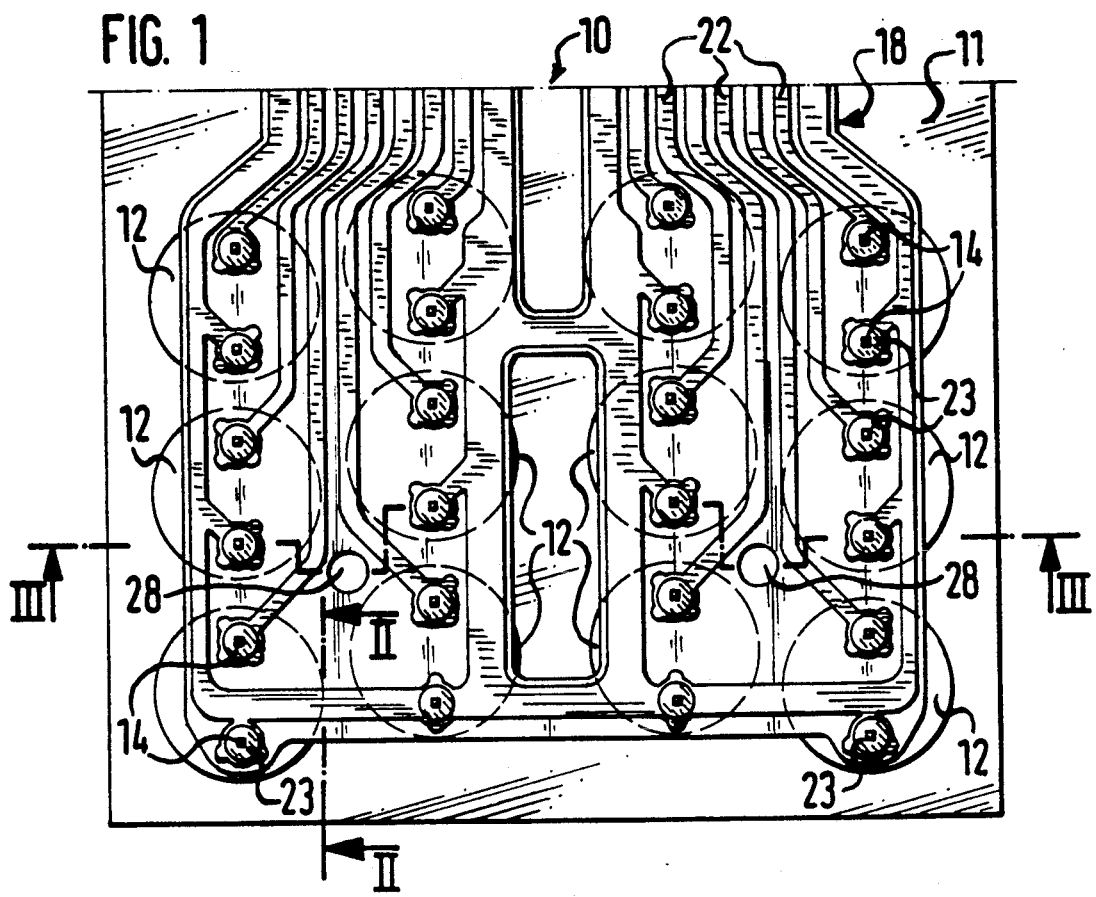
FIG. 1 is a plan view of the device with electrical components and a mounted conductor track foil.
Figure 2:
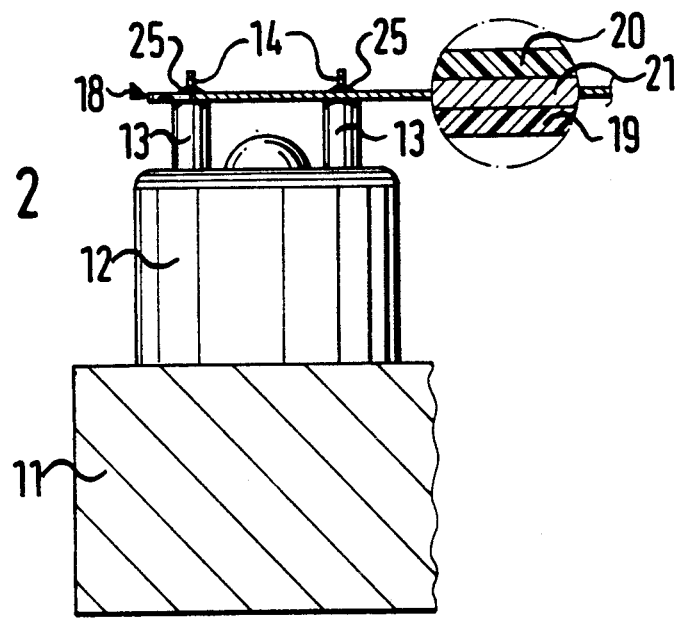
FIG. 2 is a section through the device taken along the line II—II of FIG. 1, on a different scale and with an enlarged cross section of the conductor track foil in detail form.

FIGS. 1 and 2 show a device 10, such as a valve block for a hydraulic vehicle brake system with an anti-skid and traction control apparatus, which has a housing 11 with a plurality of rows of electrical components 12, such as magnet valves, secured therein. The electrical components 12, protrude upward out of the housing 11, and are provided on the top with two support sleeves 13, from each of which one contact pin 14 protrudes for several millimeters. The contact pins 14 are square in cross section, the square measuring less than 1 mm on a side. The contact pins 14 extend at right angles to the plane of the housing 11, parallel to one another, and terminate in the same plane. They are likewise disposed in aligned rows, matching the arrangement of electrical components 12.

For bonding the electrical components 12, a flexible conductor track foil 18 is provided. As the detail of FIG. 2 shows, the conductor track foil 18 is made up of a lower insulating layer 19 and an upper insulating layer 20, with a conductor layer 21 located between them. The layer of adhesive that creates the connection between the various layers is not shown in the drawing. The two insulating layers 19 and 20 comprise a high-heat-resistant plastic, such as polyamide. The conducting layer 21 comprises a thin sheet of copper. The entire thickness of the conductor track foil 18 is approximately a tenth of a millimeter. The conductor layer 21 is embodied to make conductor tracks 22, which toward the contact pins terminate in a land 23 for soldering. A soldering land 23 represents a circular widening of the conductor track 22. In the region of the land 23 for soldering, the upper insulating layer 20 is removed in an area 4 mm in diameter; that is, in the region of the soldering land 23, the conductor track foil 18 comprises only the lower insulating layer 19 and the conducting layer 21, with the adhesive layer extending between the two.

The conductor track foil 18 is placed onto the contact pins 14 of the electrical components 12 until it rests on the support sleeve 13. In this process, the contact pins 14, which extend at right angles to the conductor track foil 18, punch through the lower insulating layer 19 and the conductor layer 21 of the soldering lands 23. The conducting layer 21 of the soldering lands 23 is thus connected in a gap-free manner to the contact pins 14 of the electrical components 12. Although the contact pins 14 are shown in FIG. 1 in a central position with respect to the soldering lands 23, the contact pins 14 can also be located eccentrically at an arbitrary point within the region of the soldering lands 23 that is free of the upper insulating layer 20. Because of this embodiment of the soldering lands 23, the conductor track foil 18 can therefore accommodate positional tolerances of the electrical components and their contact pins 14.

The soldering lands 23 of the conductor track foil 18 are connected to the contact pins 14 of the electrical components 12 by means of solder 25. The solder 25 moistens the entire region of the soldering layer 21 free of the upper insulating layer 20 inside the corresponding soldering land 23 and also the applicable contact pin 14.

Finally, the conductor track foil 18 is provided with two centering holes 28, the function of which will be described hereinafter.

Figure 3:
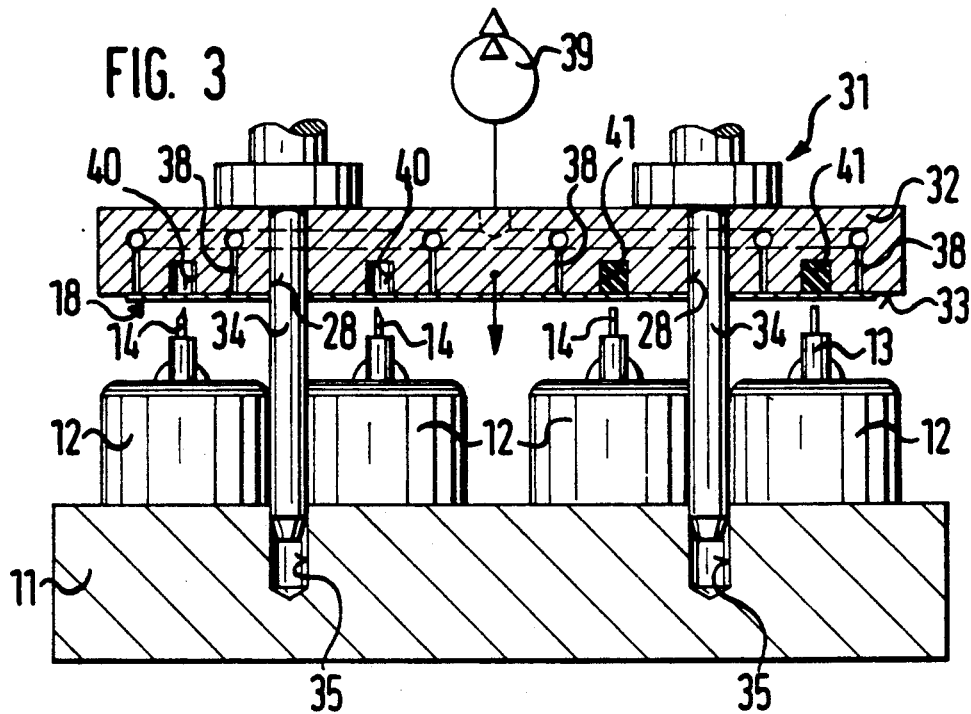
FIG. 3 is a section through the device along the line III—III of FIG. 1, again with an identically sectioned mounting apparatus for the conductor track foil, shown in a position shortly before the foils are joined to the electrical components of the device.
Figure 4:
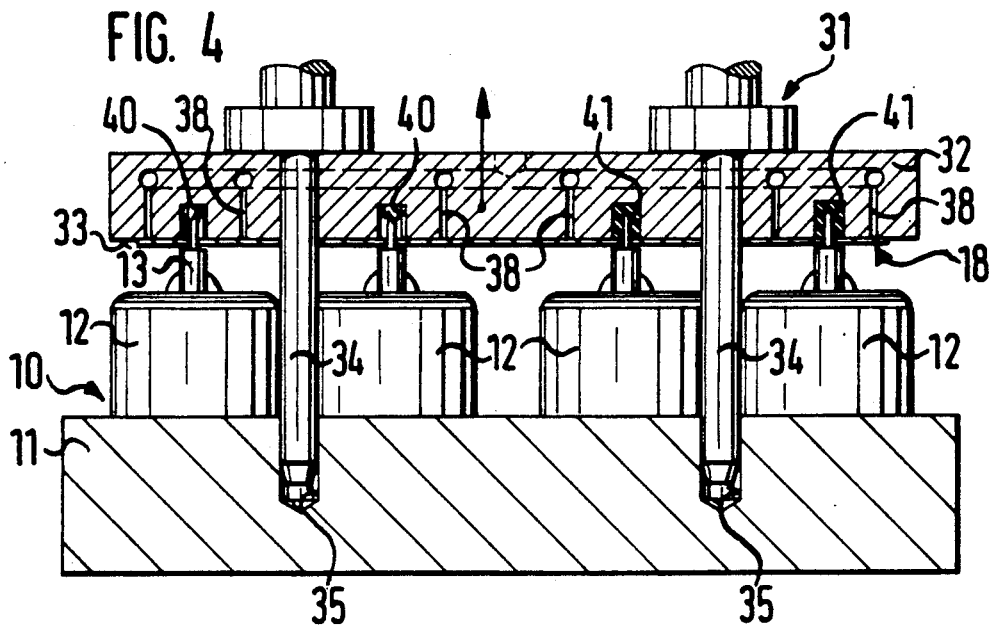
FIG. 4 is a section corresponding to FIG. 3, with the conductor track foil joined to the electrical components.

Joining of the conductor track foil 18 to the electrical components 12 of the device 10 that have the contact pins 14 is performed as follows:

An apparatus 31 is provided for mounting a conductor track foil 18 (FIGS. 3 and 4). The mounting apparatus 31 has a plate 32 with a bottom end face 33, which is larger in area than the conductor track foil 18. Two centering pins 34 extending at right angles to the end face 33 are connected to the plate 32. The centering pins 34 are disposed with a spacing that matches the spacing of the two centering holes 28 and the conductor track foil 18. The centering pins 34 are also adapted to the diameter of the centering hole 28. Since the mounting apparatus 31 having the centering pins 34 is meant to engage the inside of the housing 11 of the device 10, the housing 11 has correspondingly disposed and dimensioned positioning bores 35.

The plate 32 has a number of suction openings 38 in its end face 33 that communicate with a vacuum source 39. The suction openings 38 are disposed inside the portion of the end face 33 that is associated with the conductor track foil 18 to be received. Also provided in the plate 32 are recesses 40, the form of blind bores, that are open toward the end face 33. These recesses are provided in a number and positional association corresponding to the number of contact pins 14 of the electrical components 12 and have a depth that is at least equivalent to the free length of the contact pins 14. The diameter of the recesses 40 is the same as the region of the soldering lands 23 free of the upper insulating layer 20. In the left-hand half of FIG. 3, the recesses 40 contain no filling; in the right-hand half of FIG. 3, filler bodies 41 of an elastomer material are received in the recesses 40.

The conductor track foils 18 are suitably stacked congruently in a magazine. The soldering lands 23 of the conductor track foils 18 have no punched hole or other opening. The mounting apparatus 31 is moved until it is above the magazine and then lowered, so that the centering pins 34 penetrate the centering holes 28 of the conductor track foils 18. By applying negative pressure, the uppermost conductor track foil 18 is lifted up from the stack and retained in the end face 33 of the plate 32. Next, the mounting apparatus 31 is moved to above the device 10 provided with the electrical components 12 and lowered. In this process the centering pins 34 of the mounting apparatus 31 engage the positioning bores 35 of the housing 11, before the contact pins 14 touch the conductor track foil 18. Because of the cooperation of the centering pins 34 with the centering holes 38 of the conductor track foil 18, on the one hand, and with the positioning bores 35 of the device 10, on the other, a positionally correct association of the soldering lands 23 with the contact pins 14 is attained when the mounting apparatus 31 is lowered. In the course of the lowering movement, the contact pins 14 pierce the bottom insulating layer 19 and the conducting layer 21 in the region of the soldering lands 23 lacking the upper insulating layer 20. To facilitate this penetration, the contact pins 14 can be sharpened on their free end or sheared off on the end obliquely to their longitudinal axis, for instance in the form of a chisel-like blade with a cutting edge extending obliquely to the longitudinal axis (first and second contact pins, respectively, from the left in FIG. 3). As the conductor track foil 18 continues to be pressed down until it rests on the support sleeves 13 of the electrical components 12, the contact pins 14 extend into the free space formed by the recesses 40. As long as the conductor track foil presents increased resistance to the penetration and the danger of damage to the soldering lands 23 by their being pulled into the recesses 40 exist, this effect can be prevented by the filler bodies 41. The filler bodies 41 allow the contact pins 14, but not the conductor track foil 18, to enter the recesses.

Once the joining process has been completed, the vacuum source 39 is switched off and the mounting apparatus 31 is lifted away from the device 10. The conductor track foil 18 is released by the mounting apparatus 31 and its positional association with the device 10 by reason of the intimate, gap-free contact of the soldering lands 23 with the contact pins 14 is retained. This form-fitting and positively engaged connection between the conductor track foil 18 and the device 10 makes it unnecessary to provide for positionally securing the conductor track foil 18 upon further handling of the device 10 until the soldered connection between the soldering lands 23 and the contact pins 14 is made. Applying the solder 25 can be done either by individual soldering or by wave soldering, in which the device 10 is used with the conductor track foil 18 facing downward.

The foregoing relates to a preferred exemplary embodiment of the invention, it being understood that other variants and embodiments thereof are possible within the spirit and scope of the invention, the latter being defined by the appended claims.

What is claimed and desired to be secured by letters patent of the United States is:

1. An apparatus (31) for mounting a conductor track foil (18) onto an electrical component (12) having aligned contact pins (14), said apparatus including:

a plate (32) having an end face (33) which serves to receive and hold the conductor track foil (18) thereon, said plate (32) includes suction openings (38) therein connected to a vacuum source (39), means for aligning and positionally fixing the conductor track foil (18) relative to the end face (33) of said plate (32) and for aligning and positionally fixing the plate 932) relative to the electrical component (12), said face (33) includes aligned recesses (40) for receiving the aligned contact pins (14) of said electrical component, said aligned contact pins penetrate through the conductor track foil (18) when said end face of said plate having said conductor track foil secured thereon is lowered onto the electrical component (12).

2. An apparatus as defined by claim 1, in which said means for aligning and positionally fixing the conductor track foil (18) relative to the end face (33) includes at least two centering pins (34) that extend through centering holes (28) of the conductor track foil (18) and which engage positioning bores (35) in the electrical component.

3. An apparatus as defined by claim 1, in which one elastomer filler body (41) is received in each of the recesses (40) of the end face (33) of the plate (32).

* * * * *